(12) United States Patent
Wenske et al.

(10) Patent No.: US 10,024,889 B2
(45) Date of Patent: Jul. 17, 2018

(54) APPARATUSES, METHODS, AND SYSTEMS FOR DETECTION OF A CURRENT LEVEL

(71) Applicant: Intel IP Corporation, Santa Clara, CA (US)

(72) Inventors: Holger Wenske, Freising (DE); Stephan Henzler, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 137 days.

(21) Appl. No.: 14/998,261

(22) Filed: Dec. 23, 2015

(65) Prior Publication Data

US 2017/0184639 A1     Jun. 29, 2017

(51) Int. Cl.
*G01R 13/22* (2006.01)
*G01R 19/17* (2006.01)
*G01R 19/00* (2006.01)
*H02M 1/00* (2006.01)

(52) U.S. Cl.
CPC .......... *G01R 19/17* (2013.01); *G01R 19/0092* (2013.01); *H02M 2001/0009* (2013.01)

(58) Field of Classification Search
CPC ......... G01R 11/32; G01R 11/34; G01R 11/48; G01R 11/56; G01R 11/64; G01R 11/00; G01R 23/09; G01R 17/16
See application file for complete search history.

(56) References Cited

U.S. PATENT DOCUMENTS

| | | | | |
|---|---|---|---|---|
| 4,964,158 A | * | 10/1990 | Okochi | H04M 19/02 323/266 |
| 6,058,320 A | * | 5/2000 | Yokota | H04B 1/1615 455/572 |
| 6,255,842 B1 | | 7/2001 | Hashimoto | |
| 6,429,632 B1 | * | 8/2002 | Forbes | H02M 3/07 323/282 |
| 7,045,993 B1 | * | 5/2006 | Tomiyoshi | H02M 3/1588 323/224 |
| 7,199,589 B2 | | 4/2007 | Galvano et al. | |

(Continued)

OTHER PUBLICATIONS

International Search Report and Written Opinion dated Feb. 27, 2017 for International Application No. PCT/US2016/062594, 13 pages.

*Primary Examiner* — Tung X Nguyen
*Assistant Examiner* — Dominic Hawkins
(74) *Attorney, Agent, or Firm* — Schwabe, Williamson & Wyatt, P.C.

(57) ABSTRACT

Embodiments include apparatuses, systems, and methods including a switching converter having an output stage including a power switch or first switching device to convert an input switching signal to an output switching signal and a sensor stage including a second switching device and a third switching device. In embodiments, the sensor stage may be coupled to receive the output switching signal from the first switching device and to substantially replicate a condition of the first switching device to generate a continuous signal rather than a switched signal. In embodiments, the continuous signal may allow detection of a current level. In some embodiments, the current level may indicate an overcurrent event. A digital post-processing circuit may be coupled to the switching device to count a number of overcurrent events according to various embodiments. Other embodiments may also be described and claimed.

20 Claims, 3 Drawing Sheets

(56) References Cited

U.S. PATENT DOCUMENTS

| | | | |
|---|---|---|---|
| 9,231,542 B1* | 1/2016 | Myles | H03F 3/45183 |
| 2005/0024023 A1* | 2/2005 | Chang | H02M 1/4216 |
| | | | 323/207 |
| 2006/0158158 A1 | 7/2006 | Eberlein | |
| 2008/0278984 A1* | 11/2008 | Stanley | H02M 7/48 |
| | | | 363/95 |
| 2009/0011728 A1* | 1/2009 | Kawamoto | H03F 1/0205 |
| | | | 455/127.1 |
| 2011/0038201 A1* | 2/2011 | Takahashi | G11C 11/22 |
| | | | 365/182 |
| 2013/0265016 A1* | 10/2013 | Chang | H02M 1/08 |
| | | | 323/271 |
| 2015/0124489 A1* | 5/2015 | Dai | H02M 3/335 |
| | | | 363/17 |
| 2015/0188410 A1* | 7/2015 | Takagiwa | H02M 1/32 |
| | | | 363/56.02 |
| 2015/0236586 A1 | 8/2015 | Babazadeh et al. | |
| 2015/0276812 A1* | 10/2015 | Ferguson | G01R 1/30 |
| | | | 324/123 R |
| 2015/0288277 A1 | 10/2015 | Yan et al. | |
| 2016/0141957 A1* | 5/2016 | Ozawa | G01R 19/00 |
| | | | 323/271 |

* cited by examiner

APPARATUSES, METHODS, AND SYSTEMS FOR DETECTION OF A CURRENT LEVEL

FIELD

Embodiments of the present invention relate generally to the technical field of electronic circuits, and more particularly to detection of overcurrent conditions in an electronic circuit.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Detection of current conditions, e.g., overcurrent conditions for high-speed switching devices, can be problematic. Previous solutions have used fast comparators to assist in monitoring an instantaneous voltage of a power switch. Such comparators may be enabled during a conducting phase of the power switch and may make a decision during the active time of the power switch. For high speed switching converters, however, a comparator may need to be very fast which can result in high current consumption. Timing also needs to be accurate. For switching frequencies, e.g., above 100 megahertz (MHz), typical solutions may not be feasible. Accordingly, converters of this speed often lack overcurrent protection.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Embodiments described herein include a circuit to generate a continuous signal from a switched signal. In some embodiments, the circuit may be included in a switching converter such as a direct current-to-direct current (DCDC) converter to detect a current level and in some cases, an overcurrent event, associated with an output switching signal. In some embodiments, the switching converter may switch at a frequency greater than 100 megahertz (MHz). In various other embodiments, switching converter 100 may switch at a frequency, such as for example, smaller than 20 MHz. An output stage of the circuit includes a power switching device or first switching device to convert an input switching signal to an output switching signal and a sensor stage including a second switching device and a third switching device. The sensor stage may be coupled to the output stage to receive the output switching signal from the first switching device and to substantially replicate the first switching device or a condition of the first switching device to provide a continuous signal. The continuous signal is representative of an amplitude of the output switching signal to allow detection of an overcurrent event.

In embodiments, the continuous signal may not be pulsed with a switching frequency of the power switching device. Accordingly, the continuous signal may be provided continuously and not only during an on-phase of the power switching device. In order to determine if an overcurrent event has occurred, a comparator may receive the continuous signal from a subtractor to compare the continuous signal to a reference voltage. The comparator may then provide its results to a processing circuit that may count a number of overcurrent events in order to flag an overcurrent condition. The processing circuit may also count a number of measurement cycles that may occur without occurrence of overcurrent events.

Figure 1:
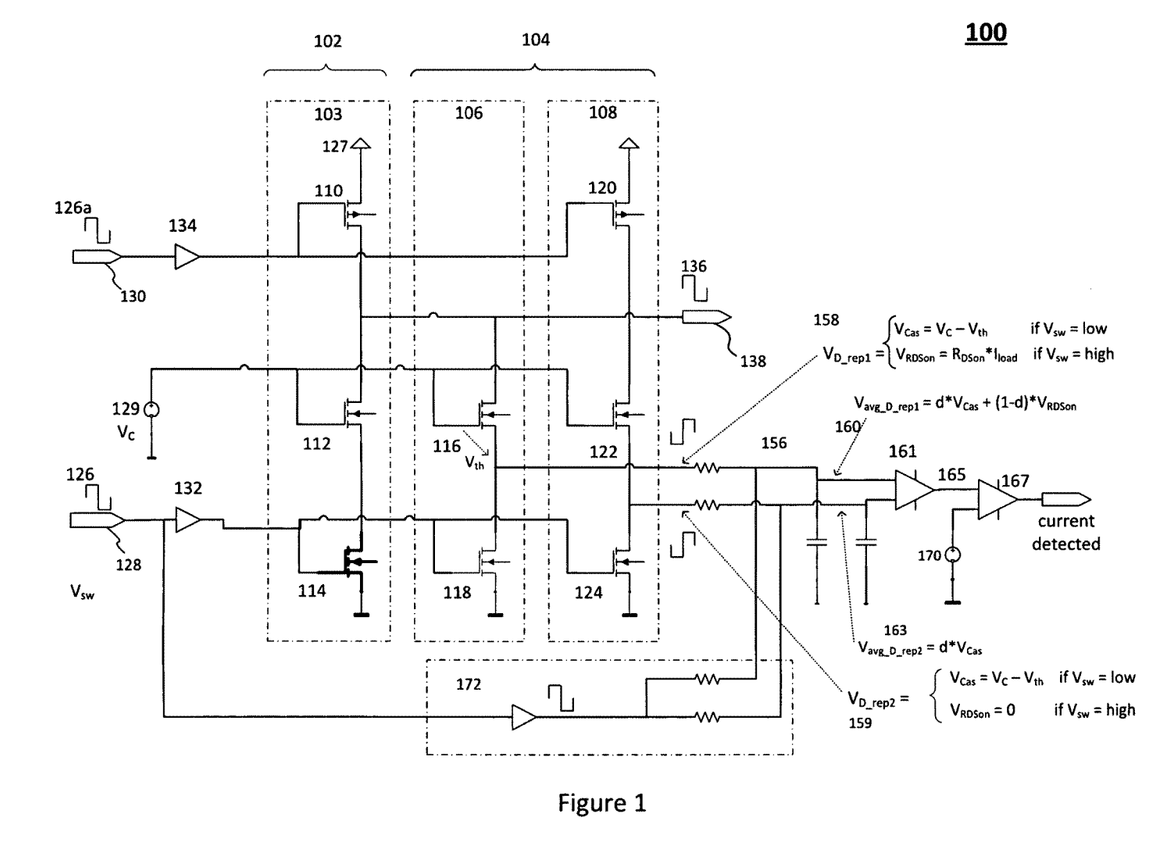
FIG. 1 illustrates an example switching converter including a circuit for detecting an overcurrent event in accordance with various embodiments.

FIG. 1 illustrates a switching converter 100 including a circuit for detecting an overcurrent event in accordance with various embodiments. In embodiments, switching converter 100 may include an output stage circuit 102 ("output stage 102") and a sensor stage circuit ("sensor stage 104") for detecting an overcurrent event produced by output stage 102. In embodiments, output stage 102 and sensor stage 104 may include a combination of switching devices that may include transistors, such as for example, p-channel metal-oxide-semiconductor field-effect transistors (p-channel MOSFET or PMOS switch) and n-type metal-oxide-semiconductor field-effect transistors (n-channel MOSFET or NMOS switch) in accordance with various embodiments. Accordingly, as illustrated in the embodiment, output stage 102 may include, for example, PMOS power switch 110, NMOS power cascode switch 112, and NMOS power switch 114, which collectively may be referred to as power switching device 103. Cascode voltage supply $V_c$ (129) may supply a voltage to NMOS power cascode switch 112.

In embodiments, output stage 102 may convert an input switching signal 126 to an output switching signal 136 to be provided at output terminal 138. Note that in embodiments, input switching signal 126 may be input at terminal 128 and may include an NMOS switching signal. In embodiments, PMOS switching signal 126a may be logically derived from input switching signal 126. In embodiments, an NMOS driver 132 may be coupled to input terminal 128 to receive and amplify input switching signal 126. In the embodiment, PMOS driver 134 may be coupled to input terminal 130 to amplify PMOS switching signal 126a. In embodiments, a slopes of PMOS switching signal 126a may be time shifted so that an active phase of input switching signal 126 and PMOS switching signal 126a may not overlap in order avoid a direct current flowing from a supply voltage 127 via PMOS power switch 110, NMOS power cascode switch 112, and NMOS power switch 114 to ground during a transition.

In the embodiment shown, a pair of replica switching devices may include a first replica switching device 106 and a second replica switching device 108. In embodiments, the pair of replica switching devices (e.g., first replica switching device 106 and second replica switching device 108) may be coupled to output stage 102 to receive output switching signal 136 and to substantially replicate power switching device 103 to provide a continuous signal 165 (rather than a signal that is pulsed with the switching frequency of the power switching device) that may be a smooth signal that may be representative of an amplitude of output switching signal 136. First replica switching device 106 may include a first NMOS replica cascode switch 116 and a first NMOS replica switch 118 which, in the embodiment, may be replica switches of respective NMOS power cascode switch 112 and NMOS power switch 114 of the power switching device 103. In the embodiment, second replica switching device 108 may include a PMOS replica switch 120, a second NMOS replica cascode switch 122, and a second NMOS replica switch 124. In embodiments, PMOS replica switch 120 may be a replica switch of PMOS power switch 110, while second NMOS replica cascode switch 122, and second NMOS replica switch 124 may also be replica switches of respective NMOS power cascode switch 112 and NMOS power switch 114.

Accordingly, in embodiments, replica switches of first replica switching device 106 and of second replica switching device 108 may be coupled in parallel with corresponding switches of power switching device 103. Note that in embodiments, the replica switches of first replica switching device 106 and of second replica switching device 108 may be significantly smaller than corresponding switches of power switching device 103. In embodiments, first replica switching device 106 and second replica switching device 108 both have a characteristic parameter which may be scaled down by a same factor as compared to a corresponding characteristic parameter of power switching device 103.

In embodiments, first replica switching device 106 may receive a portion of a current load associated with input switching signal 126 that is to be converted to output switching signal 136 while second replica switching device 108 may not receive a portion of the current load. Thus, in embodiments, second replica switching device 108 may be unloaded. In embodiments, first replica switching device 106 may receive the portion of the current load depending upon a size ratio of first replica switching device 106 to power switching device 103. As shown in FIG. 1 at 158, in embodiments, an output signal or drain voltage $V_{D\_rep1}$ of first replica switching device 106 may be given by a cascode source voltage $V_{cas}$ while a switching voltage $V_{sw}$ is low. In embodiments, the drain voltage $V_{D\_rep1}$ may be given by a voltage drop of first replica switching device 106, $V_{RDSon}$, while a switching voltage $V_{sw}$ is high. Thus:

$$V_{D\_rep1} = \begin{cases} V_{Cas} = V_C - V_{th} & \text{if } V_{sw} = \text{low} \\ V_{RDSon} = R_{DSon} * I_{load} & \text{if } V_{sw} = \text{high} \end{cases} \quad (1)$$

Note that in embodiments, $V_{th}$ may be a threshold voltage of first NMOS replica cascode switch 116 and as shown in FIG. 1, cascode voltage supply 129 may supply $V_c$. Current load may be represented by $I_{load}$, while a resistance of first replica switching device 106 may be represented by $R_{DSon}$. Accordingly, in embodiments and as shown at 159, as second replica switching device 108 may not take a portion of the current load, i.e., $I_{load}=0$, drain voltage $V_{D\_rep2}$ of second replica switching device 108 of may be given by:

$$V_{D\_rep2} = \begin{cases} V_{Cas} = V_C - V_{th} & \text{if } V_{sw} = \text{low} \\ V_{RDSon} = 0 & \text{if } V_{sw} = \text{high} \end{cases} \quad (2)$$

In embodiments, as shown in FIG. 1, output signals $V_{D\_rep1}$ and $V_{D\_rep2}$ may be provided to a filter 156. Accordingly, after filtering, average output voltages or average drain voltages of first and second replica switching devices 106 and 108 may be generated. In embodiments, average drain voltages $V_{avg\_D\_rep1}$ and $V_{avg\_D\_rep2}$ may be determined where a high voltage may be given by cascode source voltage $V_{Cas}$ for each of first replica switching device 106 and second replica switching device 108. In embodiments, a low voltage may be given by $V_{RDSon}$ for first replica switching device 106 or ground potential for second replica switching device 108. Thus, in embodiments, where $0 \le d \le 1$ and d may be the duty cycle of the switching signal, an average drain voltage $V_{avg\_D\_rep1}$ of first replica switching device 106 may be given by:

$$V_{avg\_D\_rep1} = d * V_{Cas} + (1-d) * V_{RDSon} \quad (3)$$

In embodiments, average drain voltage $V_{avg\_D\_rep2}$ of second replica switching device 108 may be given by:

$$V_{avg\_D\_rep2} = d * V_{Cas} \quad (4)$$

Note that in embodiments, d may be a high time of, e.g. output switching signal 136, divided by a period time of switching frequency. Note that the high time may be substantially equal to an on-time of PMOS power switch 110. In the embodiment, NMOS power switch 114 may be on while PMOS power switch 110 is off, i.e., in embodiments, a duty cycle of NMOS power switch 114 may be (1−d). In embodiments, average drain voltages $V_{avg\_D\_rep1}$ and $V_{avg\_D\_rep2}$ may be shown at respective locations 160 and 163 of FIG. 1.

Next, in embodiments, a subtractor, such as for example, an operational amplifier 161, may be coupled to output terminals of first and second replica switching devices 106 and 108 to output a difference between $V_{avg\_D\_rep1}$ and $V_{avg\_D\_rep2}$. Accordingly, as shown below, equation (4) may be subtracted from equation (3) so that the difference, $V_{avg\_subtr}$, may remain:

$$V_{avg\_subtr} = V_{avg\_D\_rep1} - V_{avg\_D\_rep2} = (1-d)*V_{RDSon} \qquad (5)$$

Accordingly, in embodiments, after filtering and subtraction, unimportant influences such as ground bounce, cascode voltage, and a variation of input switching signal 126, may be substantially eliminated. In embodiments, the difference $V_{avg\_subtr}$ may be continuous signal 165 that may be provided to a comparator 167 to be compared to a reference voltage 170 to detect a presence or absence of the overcurrent event.

Note that in embodiments, a common mode voltage of average drain voltages $V_{avg\_D\_rep1}$ and $V_{avg\_D\_rep2}$ may range from 0 to cascode source voltage $V_{cas}$, depending on the duty cycle. Thus, in embodiments, the difference $V_{avg\_subtr}$ between $V_{avg\_D\_rep1}$ and $V_{avg\_D\_rep2}$ may be difficult for operational amplifier 161 to process. Accordingly, in embodiments, a common mode adaption circuit 172 may be coupled to output terminals of first and second replica switching devices 106 and 108 to add a common mode adaption voltage of two substantially identical signals with inverted duty cycles to drain voltages $V_{D\_rep1}$ and $V_{D\_rep2}$ to keep the common mode voltages in a substantially proper range. In embodiments, a high voltage of drain voltages $V_{D\_rep1}$ or $V_{D\text{-}rep2}$, may be chosen so that a switching amplitude may be nearly eliminated and only a needed signal remains. For example:

Without common mode adaptation (for example $I_{DS}=0 \Rightarrow V_{RDSon}=0$):

$$V_{avg\_cm\_subtr} = (V_{avg\_D\_rep1} + V_{avg\_D\_rep2})/2 = d*V_{Cas} \qquad (6)$$

With common mode adaption (where the high common mode adaption voltage, $V_{cm\_adapt\_high}$, may be chosen to be equal to $V_{Cas}$):

$$V_{avg\_cm\_adapt} = (1-d)*V_{Cas} \qquad (7)$$

Thus, $V_{avg\_cm\_subtr}$, the difference between $V_{avg\_D\_rep1}$ and $V_{avg\_D\_rep2}$ is:

$$V_{avg\_cm\_subtr} = d*V_{Cas} + (1-d)*V_{Cas} = V_{Cas} \qquad (8)$$

Note that in embodiments, if resistors are used to add common mode adaption voltage, there may be a division factor to be considered, e.g. 0.5 for resistors of a same value.

Figure 2:
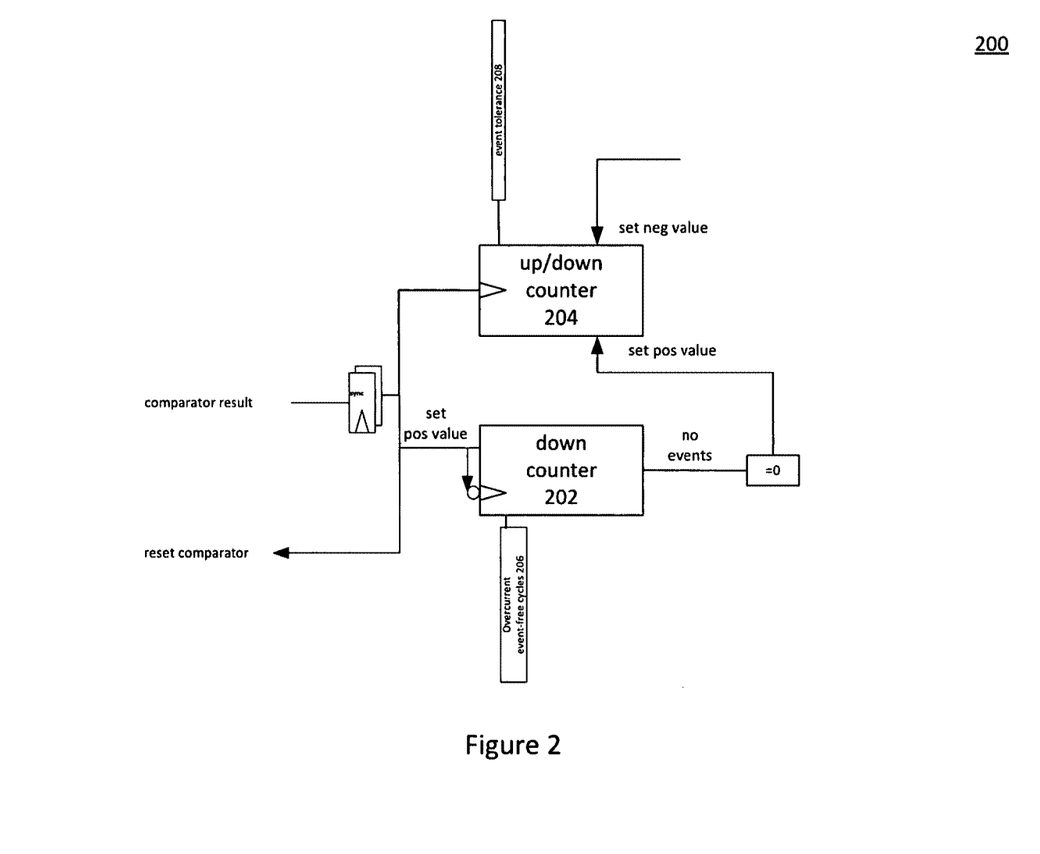
FIG. 2 illustrates an example post-processing circuit for counting the overcurrent event of the switching converter of FIG. 1, in accordance with various embodiments.

Referring now to FIG. 2, a post-processing circuit such as digital post-processing circuit 200 may be coupled to receive the determination from an output terminal of comparator 167 and to count the overcurrent event. In embodiments, digital post-processing circuit 200 may also count measurement intervals without overcurrent events or, in other words, overcurrent event-free cycles. In embodiments, each time a high current or overcurrent event is detected, a first counter, such as for example, up/down counter 204, may be decremented. In embodiments, once up/down counter 204 reaches zero, a tolerated or maximum number of overcurrent events may have been reached and digital post-processing circuit 200 may flag an overcurrent condition. In embodiments, the overcurrent condition may persist for a predefined time. There may be a wait time after flagging of an overcurrent event and output stage 102 may be deactivated to avoid damage in embodiments. This time may be determined by setting up/down counter 204 to a wait time. An existence of overcurrent event-free cycles 206, however, may trigger a reset of a second counter, down counter 202. Accordingly, in embodiments, down counter 202 may count a number of overcurrent event-free cycles, as defined by an overcurrent event free cycles number 206. In embodiments, once a predefined number of overcurrent event-free cycles may be reached, up/down counter 204 may be reset to the number of tolerated overcurrent events.

Figure 3:
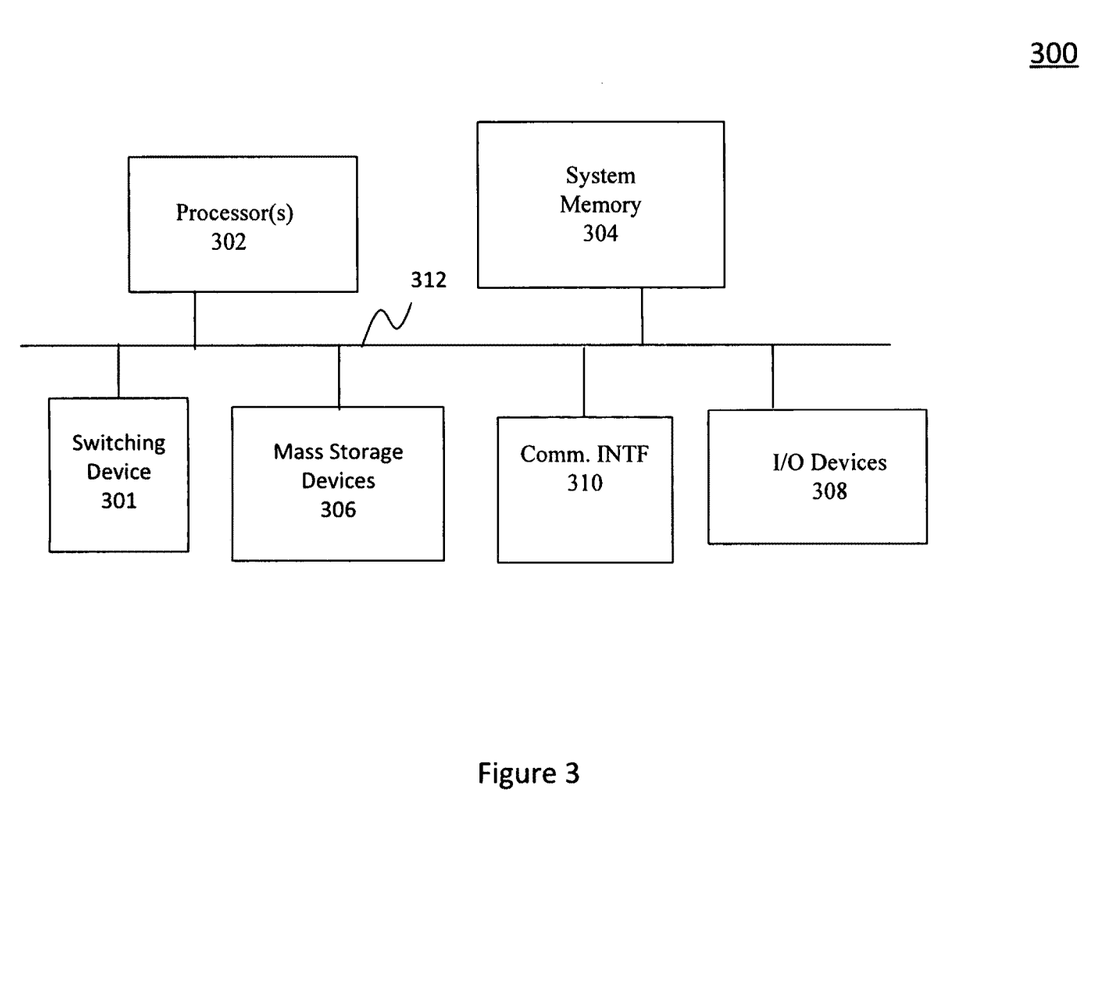
FIG. 3 illustrates an example system in accordance with various embodiments.

FIG. 3 illustrates an example computer system that may be suitable for use to practice selected aspects of the present disclosure. As shown, computer 300 may include one or more processors or processor cores 302, and a system memory 304. For the purpose of this application, including the claims, the term "processor" refers to a physical processor, and the terms "processor" and "processor cores" may be considered synonymous, unless the context clearly requires otherwise. Additionally, computer 300 may include switching device 301, mass storage devices 306 (such as diskette, hard drive, compact disc read only memory (CD-ROM) and so forth), input/output devices 308 (such as display, keyboard, cursor control, remote control, gaming controller, image capture device, and so forth), and communication interfaces 310 (such as network interface cards, modems, infrared receivers, radio receivers (e.g., Bluetooth), and so forth). The elements may be coupled to each other via system bus 312, which may represent one or more buses. In the case of multiple buses, they may be bridged by one or more bus bridges (not shown).

In embodiments, switching device 301 may be coupled to system bus 312 or may be included within one or more of elements 302-310. In embodiments, switching device 301 may include switching converter 100 of FIG. 1 and may be coupled to a digital post-processing circuit, such as for example, digital post-processing circuit 200 of FIG. 2. In embodiments, switching device 301 may include an output stage including a power switching device to convert an input switching signal to an output switching signal and a sensor stage including a pair of replica switching devices. In embodiments, the sensor stage may be coupled to the output stage to receive the output switching signal from the power switching device and substantially replicate the power switching device to provide a continuous signal that is representative of amplitude of the output switching signal.

Note that in embodiments, communication interfaces 310 may include a one or more communications chips and may enable wired and/or wireless communications for the transfer of data to and from the computing device 300. In embodiments, communication interfaces 310 may include a transceiver including a transmitter and receiver or a communications chip including the transceiver. In some embodiments, switching converter 100 and/or digital post-processing circuit 200 may be coupled to provide a current to a power amplifier that may drive a radiofrequency (RF) antenna. In embodiments, switching converter 100 may be coupled to or included in an envelope tracking circuit or other circuit to track a varying level of current. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

The communication interfaces 310 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The communication interfaces 310 may include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, Ev-DO, and others.

The elements may be coupled to each other via system bus 312, which may represent one or more buses. In the case of multiple buses, they may be bridged by one or more bus bridges (not shown). Each of these elements may perform its conventional functions known in the art. The number, capability and/or capacity of these elements 302-310 may vary, depending on whether computer 300 is used as a mobile device, a stationary device or a server. When use as mobile device, the capability and/or capacity of these elements 302-310 may vary, depending on whether the mobile device is a smartphone, a computing tablet, an ultrabook or a laptop. Otherwise, the constitutions of elements 302-310 are known, and accordingly will not be further described.

Some non-limiting Examples are provided below.

Example 1 is a switching converter including an output stage including a first switching device to convert an input switching signal to an output switching signal; and a sensor stage including a second switching device and a third switching device, the sensor stage coupled to the output stage to receive the output switching signal from the first switching device and substantially replicate a condition of the first switching device to provide a continuous signal, wherein the continuous signal is representative of the output switching signal to allow detection of a current level.

Example 2 is the switching converter of Example 1, wherein the detection of the current level is to allow detection of an overcurrent event.

Example 3 is the switching converter of Example 1, wherein the second switching device and the third switching device are replica devices of the first switching device and are coupled in parallel to the first switching device.

Example 4 is the switching converter of Example 1, wherein the second switching device and the third switching device have a characteristic parameter scaled down by a same factor as compared to a corresponding characteristic parameter of the first switching device.

Example 5 is the switching converter of Example 4, wherein the second switching device has substantially a same drain-source voltage as the first switching device while the first switching device and the second switching device are on.

Example 6 is the switching converter of Example 1, further comprising a subtractor to determine a difference between filtered outputs of the second and third switching devices to produce a difference signal from which an overcurrent event can be derived.

Example 7 is the switching converter of Example 6, further comprising a comparator coupled to an output terminal of the subtractor to compare the difference signal to a reference signal to detect the overcurrent event.

Example 8 is the switching converter of Example 7, further comprising a digital post-processor circuit coupled to an output terminal of the comparator to count an occurrence of the overcurrent event.

Example 9 is the switching converter of Example 1, wherein the input switching signal is inverted and further comprising a circuit to add a filtered version of the inverted input switching signal to the continuous signal.

Example 10 is the switching converter of any one of Examples 1-9, wherein the switching converter switches at a frequency greater than 100 megahertz (MHz).

Example 11 is the switching converter of any one of Examples 1-9, wherein the switching converter switches at a frequency smaller than 20 megahertz (MHz).

Example 12 circuit to detect a current level of an output switching signal, comprising: a first circuit portion including a first replica switching device; a second circuit portion including a second replica switching device, wherein the first and second replica switching devices comprise replica devices of a switching device of a switching converter generating the current level of the output switching signal, wherein the first and second replica switching devices simulate a condition of the switching device to produce a first continuous signal and a second continuous signal; and a subtractor, coupled to receive the first and second continuous signals from the first and second circuit portions to generate a difference signal that corresponds to a difference between the first and second continuous signals, wherein the difference signal is representative of the current level of the output switching signal.

Example 13 is the circuit of Example 12, further comprising a comparator, coupled to the subtractor to receive the difference signal from the subtractor and compare the difference signal to a reference signal to detect an overcurrent event.

Example 14 is the circuit of Example 12, wherein the first replica switching device is to receive a portion of a current load associated with an input switching signal that is converted to the output switching signal by the switching converter.

Example 15 is the circuit of Example 12, wherein the first and the second replica switching device are coupled to a voltage supply.

Example 16 is the circuit of Example 12, wherein the second replica switching device is to switch without receiving a portion of the current load associated with an input switching signal that is converted to the output switching signal by the switching converter.

Example 17 is the circuit of Example 12, wherein the switching device, first replica switching device, and second replica switching device comprise transistors.

Example 18 is the circuit of any one of Examples 12-17, wherein the first and second replica switching devices include metal-oxide-semiconductor field-effect transistor (MOSFET) cascode amplifier devices.

Example 19 is the circuit of any one of Examples 12-18, further comprising a common mode adaptation circuit, coupled to output terminals of the first and second replica switching devices, to keep a common mode voltage in a defined range.

Example 20 is a system, comprising: a processor; a memory coupled to the processor; and a transceiver coupled to the processor and the memory and operated by the processor, wherein the transceiver includes: a switching converter coupled to receive an input switching signal, wherein the switching converter includes: an output stage including a first switching device to convert the input switching signal to an output switching signal; and a sensor stage, including a second switching device and a third switching device, coupled to receive the output switching signal from the first switching device and to substantially replicate the first switching device to provide first and second output signals associated with the output switching signal; a comparator coupled to receive a continuous signal corresponding to a difference between the first and second output signals and compare the continuous signal to a reference voltage to determine whether an overcurrent event has occurred; and a post-processing circuit coupled to receive the determination from an output terminal of the comparator and to count the overcurrent event if the overcurrent event has occurred.

Example 21 is the system of Example 20, further comprising an operational amplifier coupled to first and second output terminals of the sensor stage to receive the first and second output signals and provide the continuous current to the comparator.

Example 22 is the system of any of one of Examples 20 and 21, wherein the post-processing circuit to flag the overcurrent event as an overcurrent condition when a threshold number of overcurrent events has been reached.

Example 23 is a switching converter, comprising: first means for converting an input switching signal to an output switching signal; and second means for substantially replicating a condition of the first means to provide a continuous signal representative of the output switching signal to allow detection of an overcurrent event.

Example 24 is the switching converter of Example 23, further comprising third means to measure a number of overcurrent event-free cycles.

Example 25 is the switching converter of Example 23, further comprising means to count a number of occurrences of the overcurrent event.

Example 26 is a system, comprising: a radio-frequency (RF) antenna; a power amplifier coupled to the RF antenna to drive the RF antenna; and a switching converter coupled to the power amplifier to provide an output switching signal to the power amplifier to allow the power amplifier to drive the RF antenna, wherein the switching converter includes: an output stage including a first switching device to convert an input switching signal to the output switching signal; and a sensor stage including a second switching device and a third switching device, the sensor stage coupled to the output stage to receive the output switching signal and to substantially replicate the first switching device to generate a continuous signal, wherein the continuous signal is representative of an amplitude of the output switching signal to detect an overcurrent event.

Example 27 is the system of Example 26, further comprising a digital post-processing circuit coupled to the sensor stage to receive a determination of the overcurrent event.

Example 28 is the system of Example 27, wherein the digital post-processing circuit is to count a number of overcurrent events and flag an overcurrent condition when a threshold is reached.

Although certain embodiments have been illustrated and described herein for purposes of description, this application is intended to cover any adaptations or variations of the embodiments discussed herein. Therefore, it is manifestly intended that embodiments described herein be limited only by the claims. Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A switching converter, comprising:
   an output stage including a first switching device to convert an input switching signal to an output switching signal; and
   a sensor stage including a second switching device and a third switching device, the sensor stage coupled to the output stage to receive the output switching signal from the first switching device and substantially replicate a condition of the first switching device to provide a continuous signal, wherein the continuous signal is representative of the output switching signal to allow detection of a current level, wherein the second switching device and the third switching device comprise replica devices of the first switching device and are coupled in parallel to the first switching device.

2. The switching converter of claim 1, wherein the detection of the current level is to allow detection of an overcurrent event.

3. The switching converter of claim 1, wherein the second switching device has substantially a same drain-source voltage as the first switching device while the first switching device and the second switching device are on.

4. The switching converter of claim 1, further comprising a subtractor to determine a difference between filtered outputs of the second and third switching devices to produce a difference signal from which an overcurrent event can be derived.

5. The switching converter of claim 4, further comprising a comparator coupled to an output terminal of the subtractor to compare the difference signal to a reference signal to detect the overcurrent event.

6. The switching converter of claim 5, further comprising a digital post-processor circuit coupled to an output terminal of the comparator to count an occurrence of the overcurrent event.

7. The switching converter of claim 1, wherein the input switching signal is inverted and further comprising a circuit to add a filtered version of the inverted input switching signal to the continuous signal.

8. The switching converter of claim 1, wherein the switching converter switches at a frequency greater than 100 megahertz (MHz).

9. The switching converter of claim 1, wherein the switching converter switches at a frequency smaller than 20 megahertz (MHz).

10. A circuit to detect a current level of an output switching signal, comprising:

a first circuit portion including a first replica switching device;

a second circuit portion including a second replica switching device, wherein the first and second replica switching devices comprise replica devices of a switching device of a switching converter generating the current level of the output switching signal, wherein the first and second replica switching devices are coupled in parallel to the switching device to simulate a condition of the switching device to produce a first continuous signal and a second continuous signal; and a subtractor, coupled to receive the first and second continuous signals from the first and second circuit portions to generate a difference signal that corresponds to a difference between the first and second continuous signals, wherein the difference signal is representative of the current level of the output switching signal.

11. The circuit of claim 10, further comprising a comparator, coupled to the subtractor to receive the difference signal from the subtractor and compare the difference signal to a reference signal to detect an overcurrent event.

12. The circuit of claim 10, wherein the first replica switching device is to receive a portion of a current load associated with an input switching signal that is converted to the output switching signal by the switching converter.

13. The circuit of claim 10, wherein the first and the second replica switching devices are coupled to a voltage supply.

14. The circuit of claim 10, wherein the second replica switching device is to switch without receiving a portion of a current load associated with an input switching signal that is converted to the output switching signal by the switching converter.

15. The circuit of claim 10, wherein the switching device, first replica switching device, and second replica switching device comprise transistors.

16. The circuit of claim 15, wherein the first and second replica switching devices include metal-oxide-semiconductor field-effect transistor (MOSFET) cascode amplifier devices.

17. The circuit of claim 10, further comprising a common mode adaptation circuit, coupled to output terminals of the first and second replica switching devices, to keep a common mode voltage in a defined range.

18. A system, comprising:
a processor;
a memory coupled to the processor; and
a transceiver coupled to the processor and the memory and operated by the processor, wherein the transceiver includes:
a switching converter coupled to receive an input switching signal, wherein the switching converter includes:
an output stage including a first switching device to convert the input switching signal to an output switching signal; and
a sensor stage, including a second switching device and a third switching device, coupled to receive the output switching signal from the first switching device and to substantially replicate the first switching device to provide first and second output signals associated with the output switching signal, wherein the second switching device and the third switching device comprise replica devices of the first switching device and are coupled in parallel to the first switching device;
a comparator coupled to receive a continuous signal corresponding to a difference between the first and second output signals and compare the continuous signal to a reference voltage to determine whether an overcurrent event has occurred; and
a post-processing circuit coupled to receive the determination from an output terminal of the comparator and to count the overcurrent event if the overcurrent event has occurred.

19. The system of claim 18, further comprising an operational amplifier coupled to first and second output terminals of the sensor stage to receive the first and second output signals and provide the continuous signal to the comparator.

20. The system of claim 18, wherein the post-processing circuit is to flag the overcurrent event as an overcurrent condition when a threshold number of overcurrent events has been reached.

* * * * *